US006933240B2

(12) United States Patent
Lazar et al.

(10) Patent No.: US 6,933,240 B2
(45) Date of Patent: Aug. 23, 2005

(54) METHOD FOR PATTERNING A LAYER OF SILICON, AND METHOD FOR FABRICATING AN INTEGRATED SEMICONDUCTOR CIRCUIT

(75) Inventors: Laura Lazar, Munich (DE); Matthias Kronke, Dresden (DE)

(73) Assignee: Infineon Technologies AG, Munich (DE)

(*) Notice: Subject to any disclaimer, the term of this patent is extended or adjusted under 35 U.S.C. 154(b) by 107 days.

(21) Appl. No.: 10/462,512

(22) Filed: Jun. 16, 2003

(65) Prior Publication Data

US 2003/0232505 A1 Dec. 18, 2003

(30) Foreign Application Priority Data

Jun. 14, 2002 (DE) .......................................... 102 26 603

(51) Int. Cl.[7] .......................................... H01L 21/302
(52) U.S. Cl. ...................................... 438/710; 438/424
(58) Field of Search ................................ 438/710, 424, 438/706, 714

(56) References Cited

U.S. PATENT DOCUMENTS

| | | | | |
|---|---|---|---|---|
| 5,007,982 A | * | 4/1991 | Tsou ........................... | 438/585 |
| 5,767,018 A | * | 6/1998 | Bell ............................ | 438/696 |
| 5,895,273 A | * | 4/1999 | Burns et al. ................. | 438/719 |
| 6,060,371 A | * | 5/2000 | Shinmura .................... | 438/424 |
| 6,136,211 A |   | 10/2000 | Qian et al. | |
| 6,165,695 A |   | 12/2000 | Yang et al. | |
| 6,235,214 B1 |   | 5/2001 | Deshmukh et al. | |
| 6,303,413 B1 | * | 10/2001 | Kalnitsky et al. ............ | 438/151 |
| 6,379,575 B1 | * | 4/2002 | Yin et al. ..................... | 216/67 |
| 6,527,968 B1 | * | 3/2003 | Wang et al. .................. | 216/67 |
| 6,645,870 B2 | * | 11/2003 | Negishi et al. .............. | 438/710 |
| 6,759,339 B1 | * | 7/2004 | Choi et al. ................... | 438/710 |
| 6,787,054 B2 | * | 9/2004 | Wang et al. .................. | 216/72 |
| 6,797,634 B2 | * | 9/2004 | Suzuki ......................... | 438/706 |

FOREIGN PATENT DOCUMENTS

| | | |
|---|---|---|
| DE | 101 27 888 A1 | 12/2002 |
| JP | 03141640 A | 6/1991 |
| JP | 04196315 A | 7/1992 |
| JP | 09134862 A | 5/1997 |
| WO | 02/101814 A2 | 12/2002 |

OTHER PUBLICATIONS

Mahorowala, A. P. et al.: "Etching of Polysilicon in Inductively Coupled $Cl_2$ and HBr Discharges—i. Experimental Characterization of Polysilicon Profiles", American Vacuum Society, J. Vac. Sci. Technol. B20(3), May/Jun. 2002, pp. 1055, 1057, 1059, 1061, and 1063.

Mahorowala, A. et al.: "Etching of Polysilicon in Inductively Coupled $Cl_2$ and HBr Discharges—I. Experimental Characterization of Polysilicon Profiles", http://plasma-processing.com/exprof.htm, May 9, 2003, pp. 1–23.

* cited by examiner

Primary Examiner—Michael Lebentritt
Assistant Examiner—Olivia T Luk
(74) Attorney, Agent, or Firm—Laurence A. Greenberg; Werner H. Stemer; Ralph E. Locher (57) ABSTRACT

A hard mask made from polysilicon is used to etch a layer to be patterned. The hard mask is patterned using a resist mask. The etching of the hard mask is carried out in such a way that the openings which are etched into the hard mask have inclined sidewalls. This reduces the cross section of the openings, with the result that smaller openings can be formed in the layer that is to be patterned than the openings which have been predetermined by the resist mask. The hard mask is etched using only HBr. The inclination of the openings etched into the hard mask can be set by way of the TCP power and/or the bias power of a TCP etching chamber, and/or by way of the HBr flow rate.

19 Claims, 7 Drawing Sheets

METHOD FOR PATTERNING A LAYER OF SILICON, AND METHOD FOR FABRICATING AN INTEGRATED SEMICONDUCTOR CIRCUIT

BACKGROUND OF THE INVENTION

Field of the Invention

The invention lies in the field of semiconductor technology and relates to a method for patterning a layer of silicon, in particular for patterning a layer of silicon used as a hard mask.

Layers are usually patterned using a mask which is applied to the layer which is to be patterned. The mask leaves uncovered those regions of the layer to be patterned which are to be removed by way of a subsequent etching process.

In principle, masks can be divided into two principal groups. Resist masks, which form the first group, are relatively susceptible to mechanical abrasion. Moreover, they are often not very thermally stable. On the other hand, they can be produced and patterned easily. A further advantage of the resist masks consists in the fact that they can consist of a radiation-sensitive material, in particular a photoresist, and therefore can be lithographically patterned directly. By contrast, hard masks consist of a relatively thermally stable and hard material. These masks have a higher resistance to mechanical abrasion. Hard masks are abraded to a relatively small extent in particular by anisotropic etching processes which involve targeted bombardment with reactive molecules or atoms. As a result, the structures formed in the hard mask can be transferred to the layer that is to be patterned more accurately in terms of dimensions.

Hard masks generally first of all have to be patterned by means of resist masks before they can be used as a mask.

The use of a hard mask made from amorphous silicon to form contact holes between metalization levels (the contact holes are known as vias) is known, for example, from U.S. Pat. No. 6,165,695. The amorphous silicon is first of all etched selectively with respect to a resist mask by means of magnetically enhanced reactive ion etching (MERIE) using $Cl_2$ and HBr.

Other etching processes are also known for the purpose of etching silicon selectively with respect to resist layers. For example, U.S. Pat. No. 6,235,214 B1 discloses a single-stage etch using an $SF_6/O_2/CHF_3$ mixture or a two-stage etch using an $SF_6/O_2/CHF_3$ mixture and an $SF_6/O_2$ mixture. On the other hand, the process described in U.S. Pat. No. 5,767,018 uses an $HBr/Cl_2/He—O_2$ mixture. An $HBr/Cl_2/He—O_2$ mixture for etching polysilicon is likewise used in U.S. Pat. No. 6,136,211. Other etching processes use an $NF_3/HBr$ mixture.

However, the suitability of these processes for future feature sizes which will be in the neighborhood of 140 nm and below is only limited, since in these processes the selectivity between silicon and resist mask is often low.

A further problem relates to the minimum feature size which can be achieved by lithography. This is determined, inter alia, by the wavelength of the radiation used to image the mask. To produce small structures, therefore, it is necessary to use a correspondingly short-wave radiation. There is only limited availability of suitable radiation sources for large-scale industrial use, e.g. UV lasers. Therefore, it is desirable to find measures which allow structures below the minimum feature size that can in each case be achieved with the wavelength used to be formed in some other way.

SUMMARY OF THE INVENTION

It is accordingly an object of the invention to provide a method of structuring a silicon layer which overcomes the above-mentioned disadvantages of the heretofore-known devices and methods of this general type and which exhibits good selectivity.

With the foregoing and other objects in view there is provided, in accordance with the invention, a method of patterning a layer of silicon, which comprises the following steps:

forming a resist mask on the layer of silicon; and etching the layer of silicon selectively with respect to the resist mask using an etching gas containing HBr as a substantially only chemically active etching substance.

The step of etching the layer of silicon comprises:

etching openings with inclined sidewalls into the layer of silicon;

etching the layer of silicon with a plasma-etching process with inductively coupled plasma and, in addition to electric power inductively coupled into the plasma, feeding in electric bias power, and thereby increasing an inclination of the sidewalls by at least one of reducing the inductively coupled electric power and increasing the bias power, such that the openings etched into the layer of silicon have a smaller cross section at a lower end thereof than at an upper end thereof.

The following process parameters are set in the process:

the inductively coupled electric power is less than 500 W and/or the electric bias power fed in is greater than 50 W;

a flow rate of HBr during etching of the layer of silicon is between 170 and 210 sccm; and a pressure in the reactor is between 11 and 15 mTorr.

In this context, the term chemically active etching substance is understood as meaning the substance which chemically attacks and removes the layer of silicon. Accordingly, the etching gas may if appropriate also contain inert gases, e.g. argon. Argon can be used to promote the ionization of the etching gas if necessary.

However, it is particularly preferable to use HBr alone, i.e. for the etching gas to consist of 100% of HBr. In this case, sufficient selectivity between silicon and the resist mask is achieved. HBr substantially attacks only the silicon. Dispensing with further etching gas constituents rules out the possibility of undesired removal of the resist mask, for example by the mechanical action of argon ions. Moreover, it is possible to avoid undesirable impurities. Furthermore, the use of HBr alone results in improved control of the etching process.

To further improve the selectivity, during the etching of the layer of silicon the pressure is preferably set to between 11 and 15 mTorr, preferably to 12 mTorr. It has been found that if this pressure range is maintained, compared to working at, for example, 10 mTorr, more uniform etching from the center of the substrate all the way to its outside edge is possible, i.e. the critical dimension (CD) which can be achieved by means of the etch varies to a lesser extent across the substrate. Furthermore, an HBr flow rate of between 170 and 210 sccm, in particular of 190 sccm, has proven to be favorable.

It is preferable for the etching of the layer of silicon to be carried out in such a way that the openings which are etched into the layer of silicon have inclined side walls. As a result, the cross section of the openings etched into the layer of silicon may be different on the two sides of the layer of silicon. In particular, the etch may be carried out in such a way that the openings taper toward that side of the layer of silicon which is remote from the resist mask. If the layer of silicon is for its part used as an etching mask, it is in this way possible to produce openings which have a smaller cross section than the cross section predetermined by the resist mask in a layer which is to be patterned and is arranged beneath the layer of silicon.

To achieve this, it is preferable to use a plasma etching process with inductively coupled plasma (TCP; transmission coupled plasma), wherein in addition to the electric power which is inductively coupled into the plasma, an electric bias power is fed in, to etch the layer of silicon. It has been found that the inductively coupled power and/or the bias power has an influence on the inclination of the side walls of the openings etched into the layer of silicon. The inclination of the side walls can also be set by means of the quantity of HBr supplied during the etch. Therefore, it is preferable for the inclination of the side walls to be set by the level of the inductively coupled electric power and/or the level of the bias power fed in and/or the level of the HBr flow rate.

In particular, the inclination of the side walls is increased by reducing the inductively coupled electric power and/or by increasing the bias power fed in, with the result that the openings which are etched into the layer of silicon have a smaller cross section at their lower end than at their upper end.

In this case, the inductively coupled electric power may be less than 500 W and/or the electric bias power fed in may be greater than 50 W, the inductively coupled electric power preferably being 300 W and the bias power fed in preferably being 120 W. The selectivity can likewise be increased further by suitable selection of the powers used.

The layer of silicon is preferably a layer of polysilicon or a layer of amorphous silicon.

Before the resist mask is applied, it is preferable for an antireflection coating to be deposited on the layer of silicon and etched selectively with respect to the resist mask. The antireflection coating may in this case be etched selectively with respect to the resist mask by means of an etching gas which comprises $CF_4$, the flow rate of $CF_4$ preferably being set to between 80 and 120 sccm, in particular to 100 sccm. The antireflection coating is particularly preferably etched using $CF_4$ alone. The pressure during the etching of the antireflection coating is between 5 and 10 mTorr, in particular is 7 mTorr.

With the above and other objects in view there is also provided, in accordance with the invention, a method of patterning a layer, preferably in the context of manufacturing an integrated circuit, which comprises:

applying a layer of silicon on the layer to be patterned and forming a resist mask on the layer of silicon;

performing the method according to claim 1 to structure the layer of silicon into a hard mask for patterning the layer, the hard mask having openings with inclined side walls; and etching the layer to be patterned using the layer of silicon as a hard mask.

In other words, according to a further preferred configuration of the invention, the layer of silicon is used as a hard mask during the etching of a layer which is to be patterned, and the layer of silicon is applied to the layer which is to be patterned;

the resist mask is applied to the layer of silicon;

a hard mask, the openings of which have inclined side walls, is formed from the layer of silicon by patterning with the resist mask; and the layer which is to be patterned is etched using the layer of silicon as a hard mask.

The advantage of this procedure may be regarded as lying firstly in the fact that a hard mask made from silicon or polysilicon is stronger than a resist mask and consequently the etch of the layer which is to be patterned can be carried out with a greater level of accuracy. Even a hard mask made from silicon with inclined side walls offers sufficient resistance during a subsequent anistropic etch of the layer which is to be patterned. A further advantage consists in the fact that the openings which are etched into the layer of silicon have inclined side walls with a cross section which tapers in the direction of the layer which is to be patterned. Those regions of the layer to be patterned which are not covered by the layer of silicon are therefore likewise of reduced cross section, with the result that, during the subsequent etch, structures whose cross section is smaller than the cross section which was originally predetermined by the resist mask are produced in the layer which is to be patterned. If F is used to denote the feature size (defined as the smallest period which can be achieved by the lithography used; often also referred to as the pitch), with the method according to the invention it is possible to produce structures with dimensions of less than F/2 and with a spacing of greater than F/2 in the layer which is to be patterned.

It is advantageous for the layer of silicon to be used as a hard mask in particular for a feature size F of 220 nm and below.

It is preferable for trenches which are filled with a conductive material to be etched into the layer which is to be structured and consists of an insulating material. In this case, the openings etched into the layer of silicon define the position of the trenches, the trenches, on account of the inclination of the sidewalls of the openings, having a cross section which is smaller than the cross section which was predetermined by the resist mask.

The conductive material is preferably tungsten.

The trenches produced preferably form a metalization level above the semiconductor structures of an integrated semiconductor circuit. In particular, it is possible to produce what is known as the M0 level, which represents the first wiring level above the gate structures of the integrated semiconductor circuit. The method according to the invention makes it possible to form the interconnect structures running in the trenches with dimensions which are smaller than those which are predetermined by lithography. At the same time, the spacing between adjacent structures is increased, so that the capacitance between the structures is lower. Consequently, it is possible to reduce the capacitive coupling between adjacent interconnects. Therefore, the integrated semiconductor circuit can be operated at higher clock frequencies. A further associated advantage may be considered to lie in the possibility of reducing the required storage capacitance of individual storage capacitors. When the charge stored in a storage capacitor is being read, less charge is required to charge the bit lines. Therefore, the storage capacitors can be designed to be smaller.

Therefore, the method according to the invention is preferably used in the fabrication of an integrated semiconductor circuit, in particular of a semiconductor memory, e.g. a dynamic random access memory (DRAM) or what is known as an embedded DRAM (eDRAM).

Other features which are considered as characteristic for the invention are set forth in the appended claims.

Although the invention is illustrated and described herein as embodied in a method for patterning a layer of silicon, and its use for fabricating an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE REFERRED EMBODIMENTS

Referring now to the figures of the drawing in detail, the invention will be described with reference to an integrated circuit, such as, for instance, a semiconductor memory.

Figure 1A:
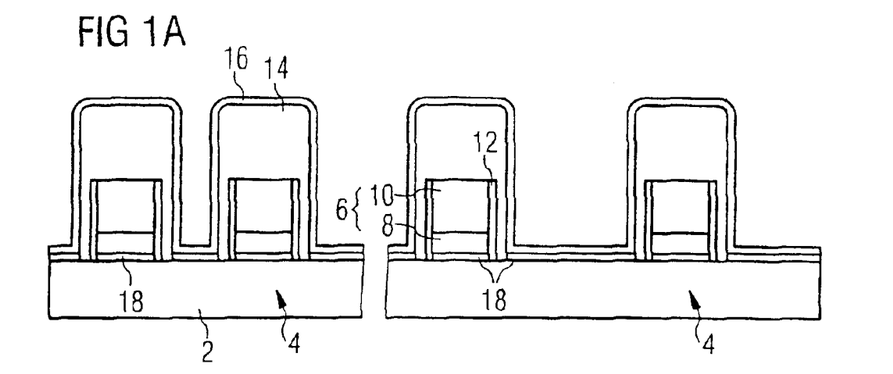
FIGS. 1A–1E are diagrammatic sectional view showing individual method steps of the method according to the invention.

FIG. 1A shows a portion of a semiconductor memory. The left-hand half of the figure illustrates what is known as the cell array, while the right-hand half of the figure shows what is known as the peripheral or support array. Gate structures 4 are arranged on a silicon substrate 2 in both arrays. The gate structures 4 comprise a gate electrode 6 which may, for example, comprise a polysilicon layer 8 and a tungsten silicide layer 10. These layers are laterally protected by edge webs 12 made from silicon oxide. A silicon nitride layer 14 and a silicon nitride liner 16 cover the gate electrodes 6. On the silicon substrate 2 there are also residues of the gate dielectric, which is also located between the gate electrodes 6 and the silicon substrate 2.

Figure 1B:
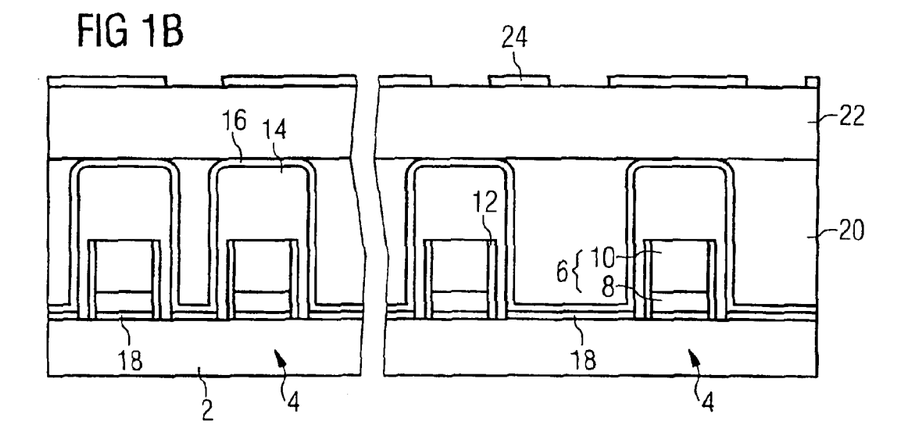

A first insulation layer 20 of, for example, silicon oxide is deposited on this structure and polished back to the top edge of the gate structures 4. A second insulation layer 22, which likewise consists of silicon oxide, and a polysilicon layer 24 are then applied. The polysilicon layer 24 is patterned using a resist mask (not shown here), so as to form all the openings in the polysilicon layer 24 which are required for the formation of contact holes. These openings define the position of the so-called CB contacts 26 (bit line contacts in the cell array), CS contacts 30 (contacts to the diffusion regions in the support array) and CG contacts 28 (contacts to the gate structures in the support array). The polysilicon mask 24 is often also referred to as a CT mask. The advantage of this procedure consists in the fact that only a single mask which has to be produced using high-resolution lithography is required. The actual etch also uses an auxiliary mask, but this can be patterned using lithography of lower resolution.

Additional information concerning this topic may be found in the commonly assigned German patent application DE 101 27 888 and the corresponding PCT publication WO 02/101814. These publications, respectively entitled "Verfahren zur Bildung von Kontaktlöchern zu einer Vielzahl von Kontaktregionen von in einem Substrat integrierten Bauelementen" and "Method for the Formation of contact holes for a Number of Contact Regions for Components Integrated in a Substrate," are herewith incorporated by reference in their entirety.

Figure 1C:
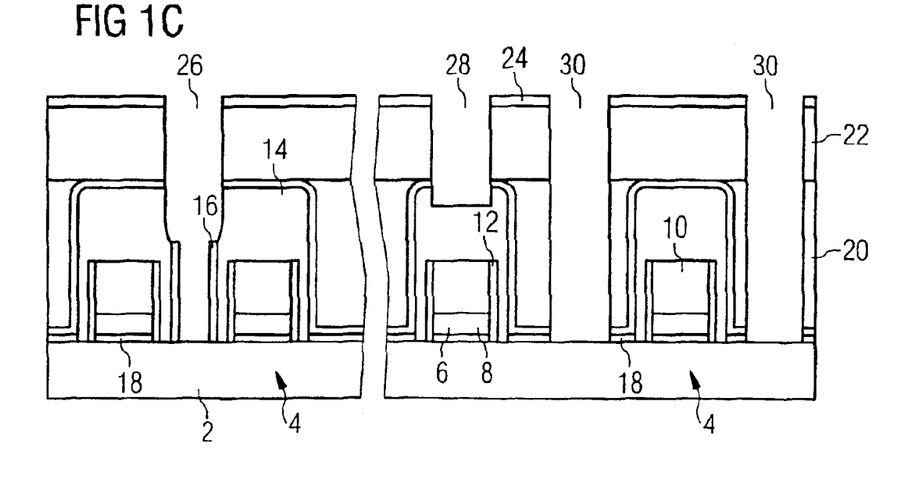

In accordance with FIG. 1C, a first etch of silicon oxide takes place selectively with respect to the material of the hard mask 24 comprising polysilicon and selectively with respect to silicon nitride. This on the one hand results in self-aligning of the CB contacts 26. The silicon nitride of the gate structures 4 is attacked to a certain degree but not completely worn away, so that a reliable lateral insulation of the gate electrodes 6 is ensured. The silicon nitride liner 16 can be thinned in the region of the side walls of the CB contacts 26. By contrast, the silicon nitride liner 16 and the gate dielectric 18 are removed at the base of the CB contacts 26. On the other hand, on account of the selectivity with respect to silicon nitride, the etch of the CG contacts 28 does not go all the way to the gate electrode 6. In the region of the CS contacts 30, the relatively thin silicon nitride liner 16 and the gate dielectric 18 are likewise removed, and consequently there the etch continues all the way to the silicon substrate 2.

Figure 1D:
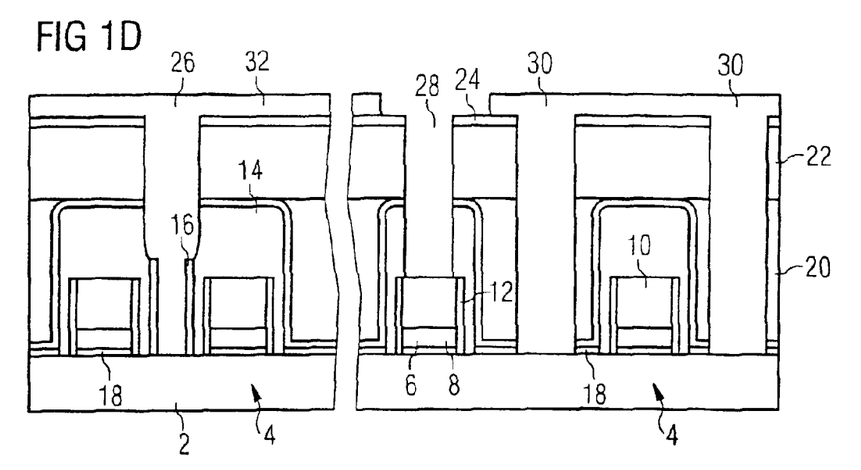

In a second etch, the silicon nitride also has to be removed in the region of the CG contacts 28. In order not to damage the silicon nitride of the gate structures 4 in the region of the CB contacts, an auxiliary mask 32, which is not critical in terms of the lithography used to produce it, is applied wherever etching is undesired. Only the CG contacts 28 remain uncovered. The auxiliary mask 32 is used, as it were, to select the CG contacts 28. After the second etch, which etches silicon nitride selectively with respect to polysilicon and oxide, all the contact holes have been completed.

Figure 1E:
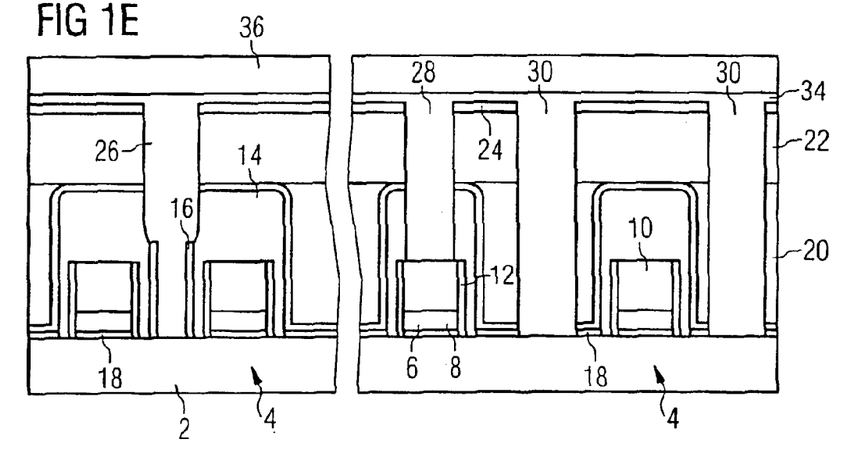

In the method steps which follow, the method according to the invention is employed. The polysilicon layer 24 which was used as a hard mask during the etching of the contact holes preferably remains in place on the second insulation layer and is then patterned again using a resist mask, trenches wherein the interconnects of what is known as the M0 level run now being produced in the second insulation layer. For this purpose, as shown in FIG. 1E, first of all an organic antireflection coating (ARC) 34 is applied in planarizing form. The material of the antireflection coating 34 is spun on and in the process completely fills the contact holes. A resist layer 36, which is subsequently lithographically patterned, is applied to the planar surface created in this way. The interconnects which are to be created in this case, at least in the cell array, run perpendicular to the word lines, which in the present instance run perpendicular to the plane of the drawing in FIGS. 1A to 1E and are formed by the gate electrodes 6. For an improved view, reference is made to FIG. 1F, which shows a plan view of an excerpt from the cell array. The interconnects to be formed are denoted by 40, connecting a plurality of CB contacts 26. As a representative example, the position of the gate structures 4 is indicated for one CB contact. The CB contacts are substantially elliptical in cross section; in the case of a feature size F of 220 nm, the large semiaxis covers approximately 170 nm and the small semiaxis covers approximately 140 nm. The objective of the etching method according to the invention which is described below is to reduce the lateral extent of the interconnects 40, so that the spacing between them is increased.

Figure 1F:
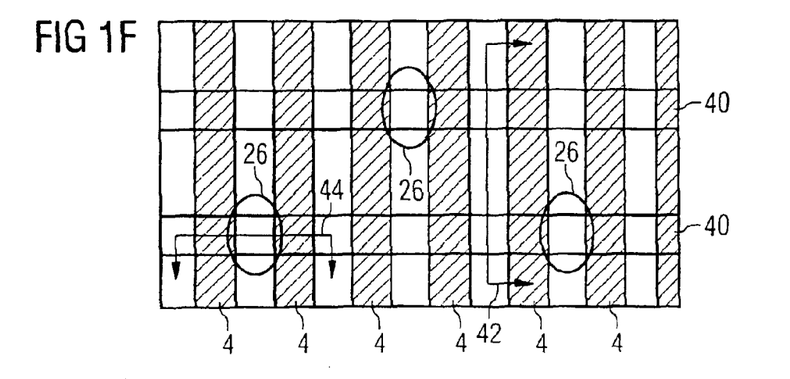
FIG. 1F is a plan view onto the cell array, showing the section line of FIGS. 1A–1E and of FIGS. 1H–1I, as well as the section line of FIG. 1G.
Figure 1G:
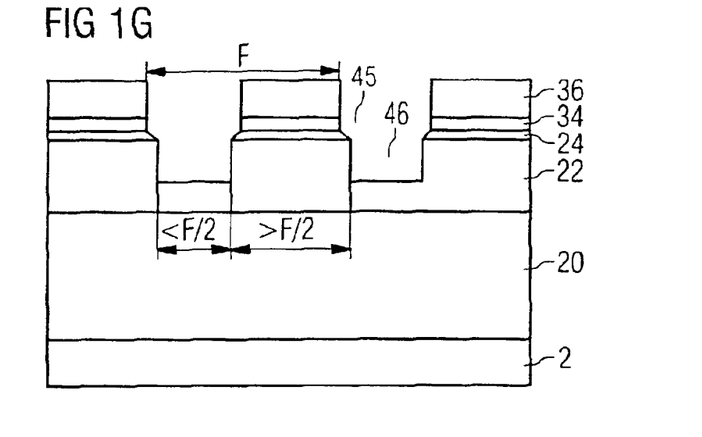
FIG. 1G is a section taken along the line 42 in FIG. 1F.

In FIG. 1F, the line 42 denotes the cross section illustrated in FIG. 1G, while the line 44 denotes the cross section of the cell array shown in the other figures.

The definition of the feature size F is likewise illustrated in the drawing presented in FIG. 1G in order to improve understanding. The definition of F can be explained most clearly on the basis of periodic structures. Accordingly, F denotes the smallest period of structures which can be achieved by means of the lithography that is being employed. In FIG. 1G, the variable F denotes the minimum spacing, for example, between the right-hand edges of adjacent structures. In the case of the minimum periodic features which can be produced by lithography, their width and their spacing is approximately F/2 on account of the imaging conditions. If the feature size remains the same, it is not possible to use lithography to reduce the width while at the same time increasing the spacing.

In the method according to the invention, first of all the antireflection coating 34 is etched by means of $CF_4$. This is followed by etching the polysilicon layer 24 to form inclined side flanks using exclusively HBr. As a result, the openings 45 etched into the polysilicon layer 24 taper in the direction of the second insulation layer 22. The cross section of the opening 45 etched into the polysilicon layer 24 therefore decreases in the direction of the second insulation layer 24. On account of the inclined side walls, during the subsequent etch trenches 46 whose width is less than F/2 and whose spacing is greater than F/2 are introduced into the second insulation layer 22. If inclined side walls were not formed, trenches whose width and spacing would be approximately F/2 would be formed.

Figure 1H:
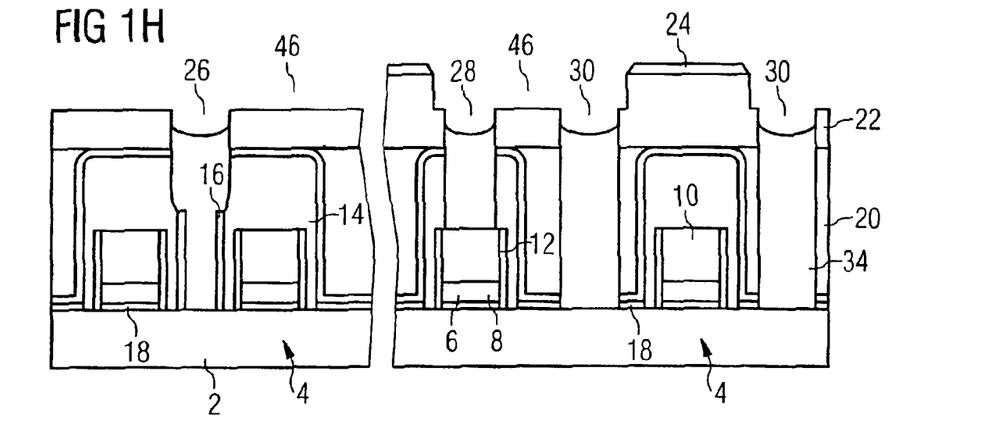
FIGS. 1H and 1I are sections taken along the line 44 in FIG. 1F.

The situation after the etch of the second insulation layer 22 is shown in FIG. 1H. In the region of the cell array, a trench 46 runs along this section. In the region of the support array, trenches 46 for the interconnects are created where contact holes are to be connected to one another. It is clearly apparent that the etching of the antireflection coating 34 continued until the upper region of the contact holes 26, 28 and 30 was uncovered.

Figure 1I:
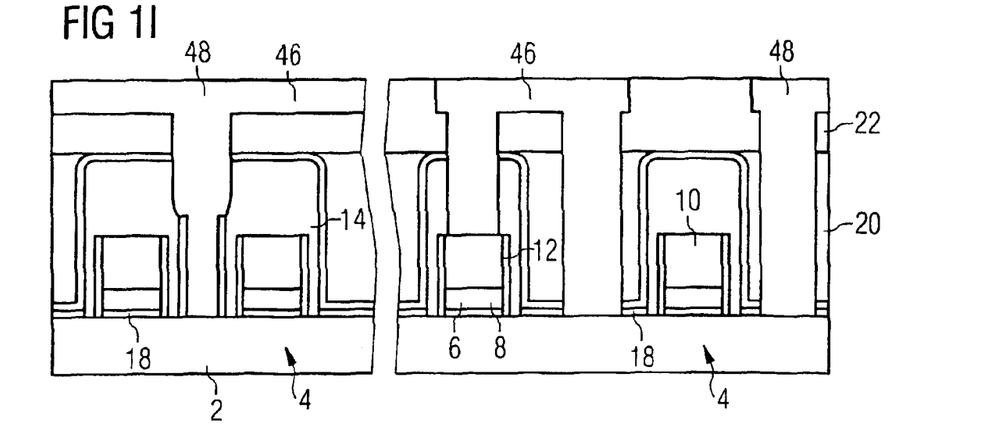

After etching of the second insulation layer 22 to form the trenches 46, the resist mask 36 and the antireflection coating 34 are removed by incineration. In the process, the contact holes 26, 28 and 30 are uncovered. This is followed by conformal deposition of a Ti/TiN liner. During a subsequent anneal (heat treatment), titanium silicide is formed at the base of the contact holes 26, 28 and 30 from the deposited titanium and the silicon substrate 2 uncovered at those locations, and this titanium silicide contributes to reducing the contact resistance. At the same time, the polysilicon layer 24 which is still present is likewise converted into titanium silicide by reacting with the titanium deposited there. The anneal is followed by the deposition of a conductive material 48, in particular tungsten, in order to fill the contact holes 26, 28, 30 and the trenches 46. Excess tungsten 48 is removed by means of a CMP step wherein the TiN is removed at the same time, since it has similar polishing properties to tungsten. The titanium silicide which is still present on the second insulation layer 22 is then removed using a second polishing step (known as a "touch up"). This method of forming interconnects and contact holes is also referred to as a dual damascene process. The finished structure is shown in FIG. 1I.

Figure 5:
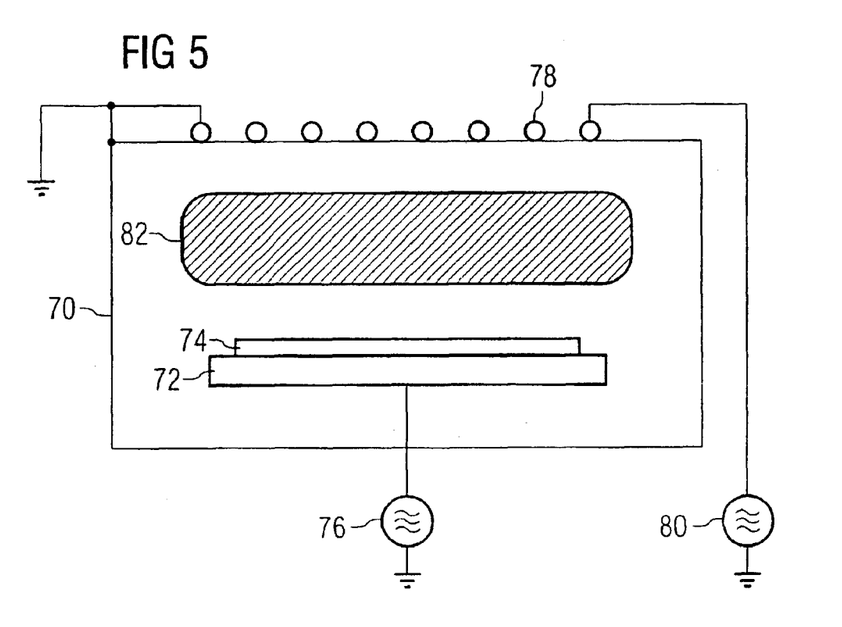
FIG. 5 is a schematic view of a TCP etching chamber.

The etching of the antireflection coating 34 and of the polysilicon layer 24 is carried out using a TCP etching chamber illustrated by way of example in FIG. 5. In the case of the antireflection coating 34, the only etching gas used is $CF_4$, and in the case of the polysilicon layer 24 the only etching gas used is HBr. The inclination of the side walls of the openings 45 which have been etched into the polysilicon layer can be adjusted by adjusting the bias power which is fed in and/or the inductively coupled power (TCP power) and/or the flow rate of HBr. Specific results in this respect are illustrated by way of example in FIGS. 2A to 2C, which show scanning electron microscope images (SEM micrographs) of etched polysilicon and antireflection coatings. In these images, the lower structured layer represents the polysilicon layer. During the etch of the polysilicon layer shown in FIG. 2A, an inductively coupled power (TCP power) of 500 W was set. The bias power was 120 W. In this way it is possible to etch relatively steep side walls. By contrast, the etch of the polysilicon layer shown in FIG. 2B was carried out using a bias power which had been increased to 210 W and a TCP power of 300 W. The relatively great inclination of the side walls is clearly apparent. By contrast, in FIG. 2C, to etch the polysilicon layer shown there, the bias power was reduced to 50 W with a TCP power of 300 W. Once again, the side walls are virtually vertical. The three FIGS. 2A–2C also give information relating to the thickness of the resist mask, of the antireflection coating and of the polysilicon layer. From the results shown, it is possible to draw the general conclusion that the inclination of the side walls can be increased by increasing the bias power and/or reducing the TCP power. The openings which were etched into the polysilicon layer under these conditions therefore have a smaller cross section at their end which faces the second insulation layer than at their end which faces the resist mask. By suitably modifying the TCP and bias powers selected, it is, of course, also possible to etch virtually vertical side walls.

Figure 2A:
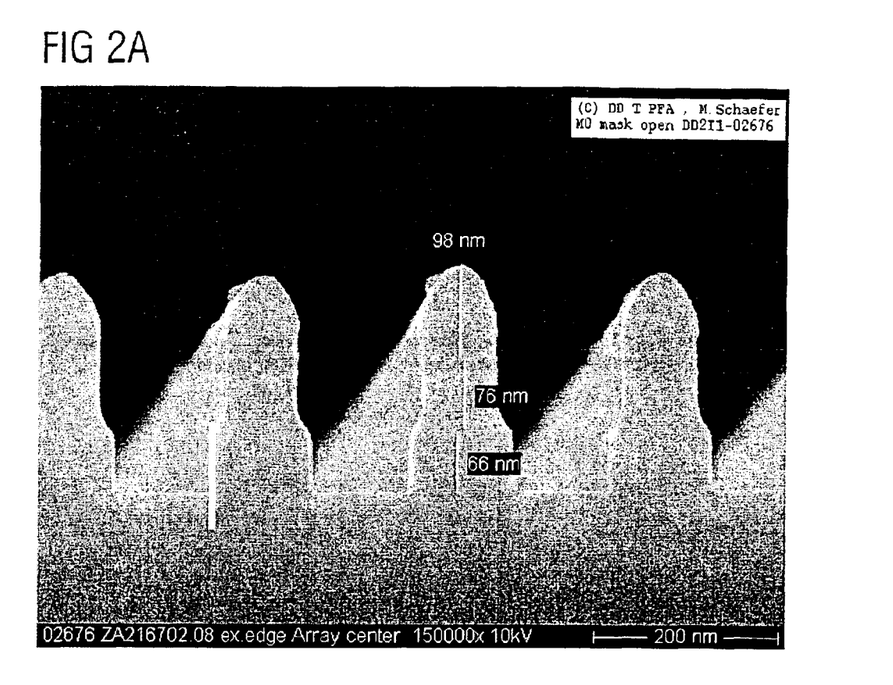
FIGS. 2A–2C are SEM images of etched polysilicon layers for different bias and inductively coupled powers (TCP powers)
Figure 2B:
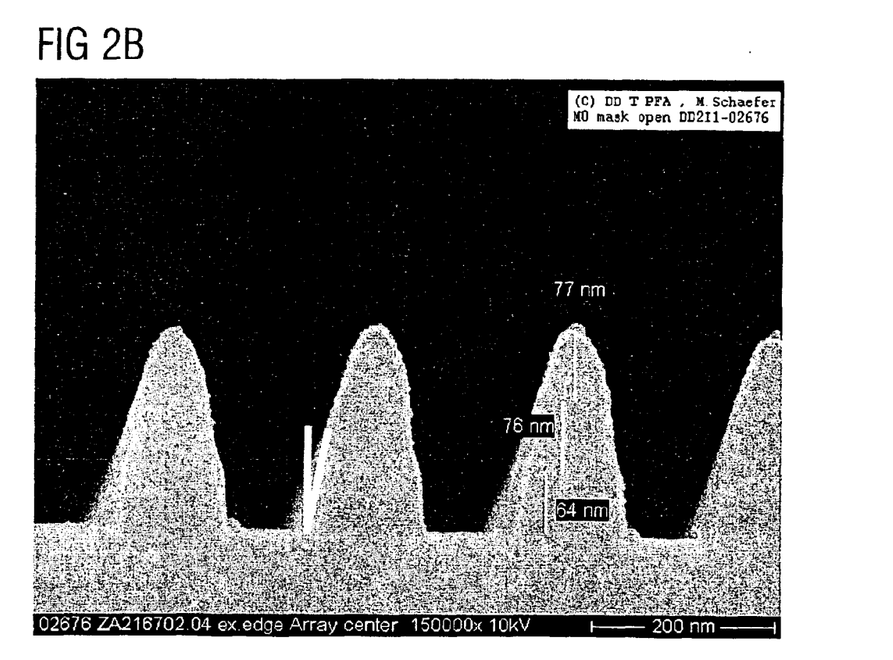
Figure 2C:
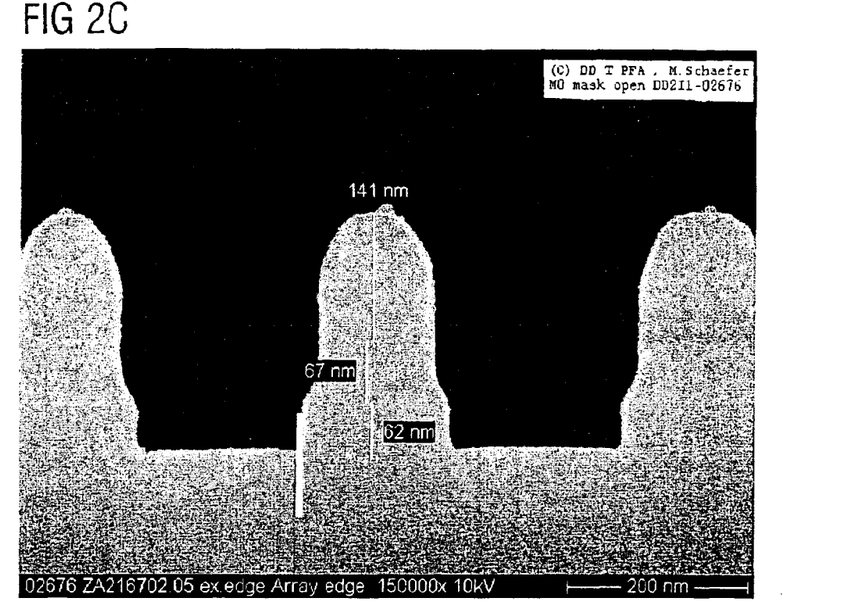

The relevant parameters for the etch of the polysilicon layers illustrated in FIGS. 2A to 2C are summarized in the table below.

| FIG. | TCP power [W] | Bias power [W] | HBr flow rate [sccm] |
|---|---|---|---|
| 2A | 500 | 120 | 190 |
| 2B | 300 | 210 | 190 |
| 2C | 300 | 50 | 190 |

For periodic structures as are encountered in particular in the cell array of a semiconductor memory, the spacing between the structures is determined by lithography. It is only possible to increase the spacing if the feature size F is increased at the same time. However, this is undesirable. This problem can be solved by the method according to the invention in that the polysilicon mask is not, as is customary, etched as far as possible anisotropically. Rather, it is aimed to use an etch which leads to tapering openings. An etch of this type is usually undesirable.

On account of a polysilicon layer of this type being used as a hard mask for patterning the second insulation layer, it is possible to produce openings or trenches which are smaller than those which are predetermined by lithography in this layer. At the same time, these openings or trenches are at a greater spacing from one another compared to the resist mask. Therefore, if the feature size remains constant, it is possible to produce structures smaller than the resolution which can be achieved by lithography and at a greater spacing from one another.

The associated advantage can be considered to lie in particular in reduced electrical coupling of the structures produced. In the case of bit lines which run in the M0 level, the capacitance between the bit lines and therefore the extent to which they influence one another can thereby be reduced. By way of example, if there is strong coupling, a bit line which is at a higher potential can erroneously draw a bit line which is at a lower potential to a higher potential. These influences are reduced according to the invention.

A further advantage resides in the possibility of reducing the storage capacitance required for storage capacitors.

Figure 3A:
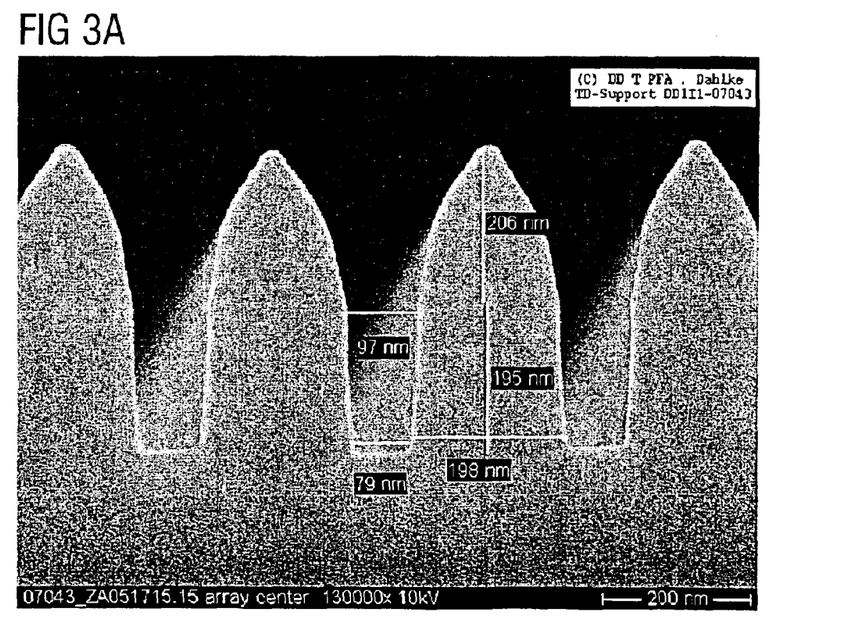
FIGS. 3A–3C are SEM images of etched polysilicon layers.
Figure 3B:
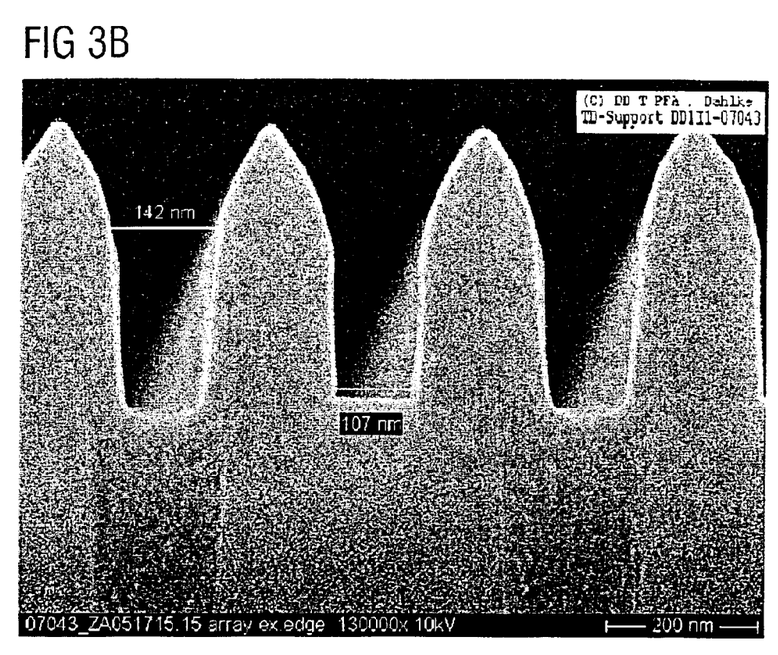
Figure 3C:
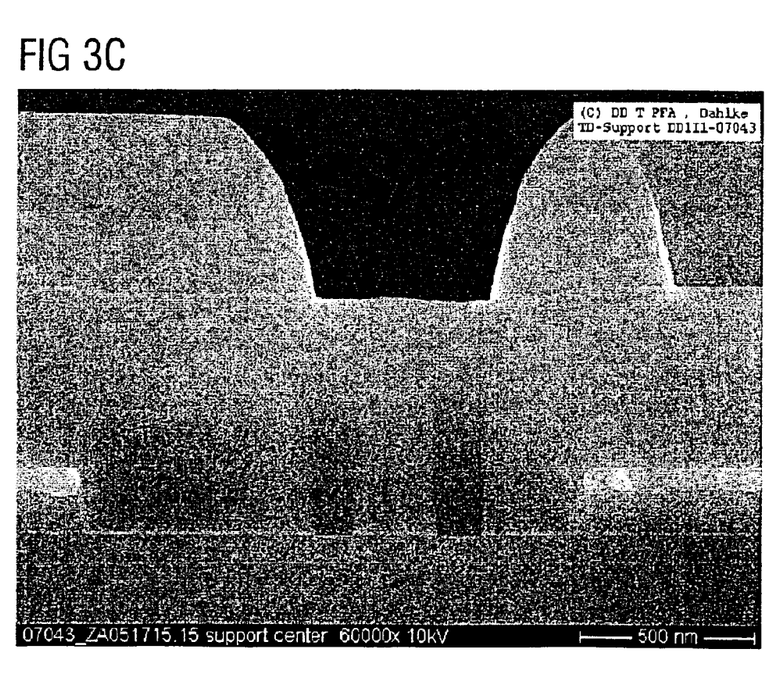

FIGS. 3A–3C show etched polysilicon layers in the center and at the edge of a semiconductor wafer, a lithography with a minimum feature size F of 220 nm having been used for patterning. FIG. 3A shows images of the cell array from the center of the wafer, whereas FIG. 3B shows an image of the cell array from the edge of the wafer. FIG. 3C, by contrast, represents peripheral structures (support structures) in the center of the wafer.

Figure 4:
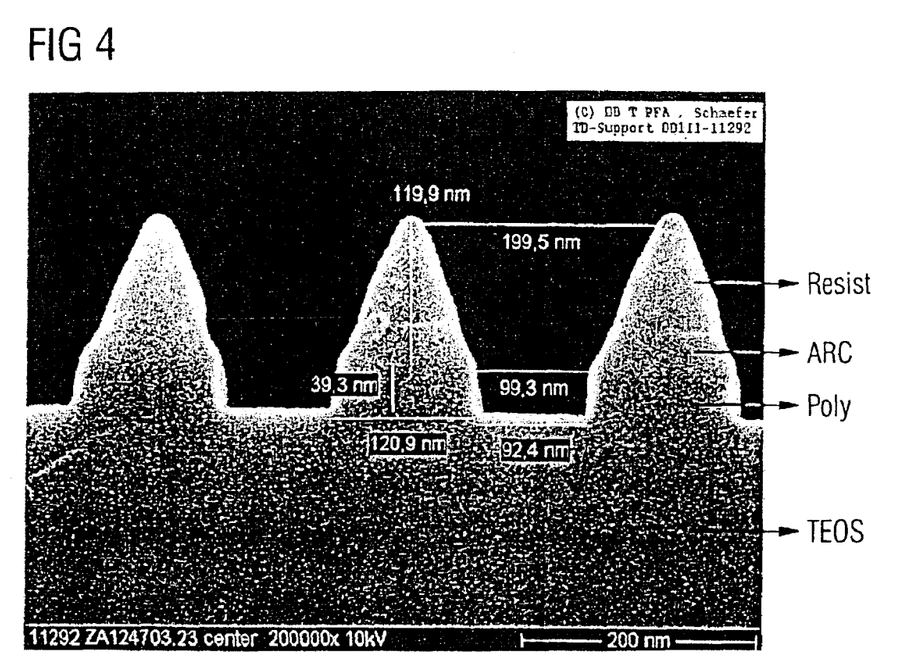
FIG. 4 is a SEM image of an etched layer sequence comprising an ARC layer and a polysilicon layer.

FIG. 4 likewise shows an SEM image. The polysilicon layer has a thickness of 39 nm. As can be seen, the cross section of the opening etched into the polysilicon layer is approximately 6 nm smaller at its lower end than at its upper end.

An outline illustration of a TCP etching chamber is shown in FIG. 5. The housing 70 of the etching chamber is connected to ground. The substrate carrier 72 on which the semiconductor substrate 74 which is to be processed rests is located inside the housing 70. The substrate carrier 72, which is provided with a non-illustrated integrated He cooling system simultaneously serves as a lower electrode, is connected to a radio frequency source 76 which feeds in an electric bias power. Above the housing 70 is the coupling-in coil 78 which couples electric power originating from a radio frequency source 80 into the plasma 82. By selecting the bias power fed in and the inductively coupled power, it is possible to adjust the steepness of the side walls. The coupling-in coil 78 simultaneously serves as an upper electrode.

The table below shows a specific example with regard to the etching of antireflection coating and polysilicon layer. The etch was carried out in an etching chamber of the type LAM TCP 9400 with a bottom shadow ring (BSR). The shadow ring covers the edge of the wafer.

Both the ARC coating and the polysilicon layer were etched to the end point with a subsequent defined overetch.

We claim:

1. A method of patterning a layer of silicon, which comprises the following steps:

forming a resist mask on the layer of silicon; and etching the layer of silicon selectively with respect to the resist mask using an etching gas containing HBr as a substantially only chemically active etching substance;

wherein the step of etching the layer of silicon comprises:
      etching openings with inclined sidewalls into the layer of silicon;
      etching the layer of silicon with a plasma-etching process with inductively coupled plasma and, in addition to electric power inductively coupled into the plasma, feeding in electric bias power, and thereby increasing an inclination of the sidewalls by at least one of reducing the inductively coupled electric power and increasing the bias power, such that the openings etched into the layer of silicon have a smaller cross section at a lower end thereof than at an upper end thereof; and:
      setting the inductively coupled electric power to less than 500 W and/or setting the electric bias power fed in to greater than 50 W;
      setting a flow rate of HBr during etching of the layer of silicon to between 170 and 210 sccm; and
      setting a pressure to between 11 and 15 mTorr.

2. The method according to claim 1, wherein the etching gas contains exclusively HBr.

3. The method according to claim 1, which comprises feeding in substantially 300 W of inductively coupled electric power and substantially 120 W of bias power.

4. The method according to claim 1, wherein the layer of silicon is a layer of polysilicon or a layer of amorphous silicon.

5. The method according to claim 1, which comprises setting a flow rate of HBr to 190 sccm during the step of etching the layer of silicon.

6. The method according to claim 1, which comprises setting a pressure to 12 mTorr during the step of etching the layer of silicon.

| Step | 1 Stabilization | 2 ARC | 3 ARC overetch | 4 Poly | 5 Poly overetch | 6 Pumping out |
|---|---|---|---|---|---|---|
| Pressure [mTorr] | 7 | 7 | 7 | 12 | 12 | 0 |
| $RF_{upper}$ (TCP) [W] | 0 | 200 | 200 | 300 | 300 | 0 |
| $RF_{lower}$ (Bias) [W] | 0 | 120 | 120 | 120 | 120 | 0 |
| $CF_4$ [sccm] | 100 | 100 | 100 | 0 | 0 | 0 |
| Cl2 [sccm] | 0 | 0 | 0 | 0 | 0 | 0 |
| $NF_3$ [sccm] | 0 | 0 | 0 | 0 | 0 | 0 |
| $SF_6$ [sccm] | 0 | 0 | 0 | 0 | 0 | 0 |
| HBr [sccm] | 0 | 0 | 0 | 190 | 190 | 0 |
| 70% He/30% $O_2$ [sccm] | 0 | 0 | 0 | 0 | 0 | 0 |
| End after | Stabilization | End point detection | Stipulated time | End point detection | Stipulated time | Stipulated time |
| Max. time [s] | 20 | 36 | 5 | 20 | 5 | 5 |
| Upper electrode temp. [° C.] | 60 | 60 | 60 | 60 | 60 | 60 |
| Chamber temp. [° C.] | 60 | 60 | 60 | 60 | 60 | 60 |
| Lower electrode temp. [° C.] | 50 | 50 | 50 | 50 | 50 | 50 |
| Cooler temp. [° C.] | 50 | 50 | 50 | 50 | 50 | 50 |

7. A method of patterning a layer, which comprises:
applying a layer of silicon on the layer to be patterned and forming a resist mask on the layer of silicon;
performing the method according to claim 1 to structure the layer of silicon into a hard mask for patterning the layer, the hard mask having openings with inclined side walls; and
etching the layer to be patterned using the layer of silicon as a hard mask.

8. The method according to claim 7, wherein the layer to be patterned is a layer of insulating material and the method comprises etching trenches into the layer and filling the trenches with a conductive material.

9. The method according to claim 8, wherein the conductive material is tungsten.

10. The method according to claim 8, wherein the openings etched into the layer of silicon define a position of the trenches, and the trenches, on account of the inclination of the sidewalls of the openings, have a cross section smaller than a cross section predetermined by the resist mask.

11. The method according to claim 1, which comprises, prior to the step of forming the resist mask, applying an antireflection coating to the layer of silicon, and etching the antireflection coating selectively with respect to the resist mask.

12. The method according to claim 11, wherein the step of etching the antireflection coating selectively with respect to the resist mask comprises etching with an etching gas comprising $CF_4$.

13. The method according to claim 12, which comprises setting a flow rate of $CF_4$ during the etching of the antireflection coating to between 80 and 120 sccm.

14. The method according to claim 13, which comprises setting the flow rate of $CF_4$ to 100 sccm.

15. The method according to claim 12, which comprises etching the antireflection coating exclusively with $CF_4$.

16. The method according to claim 11, which comprises setting a pressure during the etching of the antireflection coating to between 5 and 10 mTorr.

17. The method according to claim 16, which comprises setting the pressure to 7 mTorr.

18. In combination with a method of fabricating an integrated semiconductor circuit, the method according to claim 1.

19. The method according to claim 18, wherein the integrated semiconductor circuit to be fabricated is a semiconductor memory.

* * * * *